United States Patent
Ayraud et al.

(10) Patent No.: US 10,396,736 B2
(45) Date of Patent: Aug. 27, 2019

(54) ATTENUATOR DEVICE IN A RADIO FREQUENCY TRANSMISSION STAGE

(71) Applicant: STMicroelectronics (Grenoble 2) SAS, Grenoble (FR)

(72) Inventors: Michel Ayraud, Voreppe (FR); Serge Ramet, Jarrie (FR); Serge Pontarollo, Saint-Egreve (FR)

(73) Assignee: STMICROELECTRONICS (GRENOBLE₂) SAS, Grenoble (FR)

( * ) Notice: Subject to any disclaimer, the term of this patent is extended or adjusted under 35 U.S.C. 154(b) by 7 days.

(21) Appl. No.: 15/609,736

(22) Filed: May 31, 2017

(65) Prior Publication Data
US 2018/0152158 A1    May 31, 2018

(30) Foreign Application Priority Data
Nov. 29, 2016   (FR) ...................................... 16 61631

(51) Int. Cl.
| H03F 3/04 | (2006.01) |
| H03G 3/30 | (2006.01) |
| H01P 1/22 | (2006.01) |
| H03F 1/56 | (2006.01) |
| H03F 3/191 | (2006.01) |

(52) U.S. Cl.
CPC ................ *H03G 3/30* (2013.01); *H01P 1/22* (2013.01); *H03F 1/565* (2013.01); *H03F 3/191* (2013.01); *H03G 3/3042* (2013.01); *H03G 3/3057* (2013.01); *H03F 2200/211* (2013.01); *H03F 2200/294* (2013.01); *H03G 2201/106* (2013.01)

(58) Field of Classification Search
CPC ...... H03G 3/30; H03G 3/3057; H03G 3/3042; H03G 2201/106; H03F 3/191; H03F 1/565; H03F 2200/294; H03F 2200/211; H01P 1/22
USPC ......................................... 330/284, 285, 296
See application file for complete search history.

(56) References Cited

U.S. PATENT DOCUMENTS

| 6,392,490 | B1 * | 5/2002 | Gramegna | ............... | G05F 3/205 |
| | | | | | 330/283 |
| 6,714,081 | B1 * | 3/2004 | Xu | .......................... | H03F 1/301 |
| | | | | | 323/315 |
| 7,489,196 | B2 * | 2/2009 | Vaiana | ................... | H03F 1/0261 |
| | | | | | 330/285 |
| 7,567,126 | B2 * | 7/2009 | Arai | ........................ | H03F 1/301 |
| | | | | | 330/285 |

(Continued)

FOREIGN PATENT DOCUMENTS

| JP | 2006081009 A | 3/2006 |
| JP | 2014050055 A | 3/2014 |

*Primary Examiner* — Khanh V Nguyen
(74) *Attorney, Agent, or Firm* — Slater Matsil, LLP (57) ABSTRACT

The transmission device comprising a transmit stage configured to deliver a transmission signal on an input-output node of an antenna and comprising a power transistor coupled to the input-output node and configured to amplify a signal to be transmitted. The device comprises a receive stage configured to receive a reception signal on the input-output node and comprising an attenuator circuit configured to attenuate the reception signal. The attenuator circuit comprising the power transistor and a control circuit able to place the power transistor in a triode mode.

22 Claims, 4 Drawing Sheets

(56) References Cited

U.S. PATENT DOCUMENTS

| | | | |
|---|---|---|---|
| 7,733,186 B2* | 6/2010 | Hosoya | G05F 3/20 |
| | | | 330/289 |
| 7,915,883 B2* | 3/2011 | Chida | G05F 1/563 |
| | | | 315/307 |
| 8,093,952 B2* | 1/2012 | Behzad | H03F 1/301 |
| | | | 330/285 |
| 9,130,509 B2* | 9/2015 | Xu | G01S 19/21 |
| 9,294,044 B2* | 3/2016 | Kawai | H03F 1/301 |
| 2011/0025422 A1 | 2/2011 | Marra et al. | |
| 2014/0300419 A1 | 10/2014 | Kawai et al. | |

\* cited by examiner

| | B1 | B2 | B3a | B3b | B4 |
|---|---|---|---|---|---|
| 0dB | 0 | 0 | 0 | 0 | 1 |
| -6dB | 1 | 1 | 0 | 1 | 0 |
| -12dB | 0 | 1 | 0 | 0 | 0 |
| -18dB | 0 | 0 | 1 | 0 | 0 |

FIG.7

ATTENUATOR DEVICE IN A RADIO FREQUENCY TRANSMISSION STAGE

CROSS-REFERENCE TO RELATED APPLICATIONS

This application claims priority to French Patent Application No. 1661631, filed on Nov. 29, 2016, which application is hereby incorporated herein by reference.

TECHNICAL FIELD

Embodiments and modes of implementation relate to the transmission of signals, notably radiofrequency signals, and in particular embodiments the attenuation of a signal received by an antenna.

BACKGROUND

Figure 1:
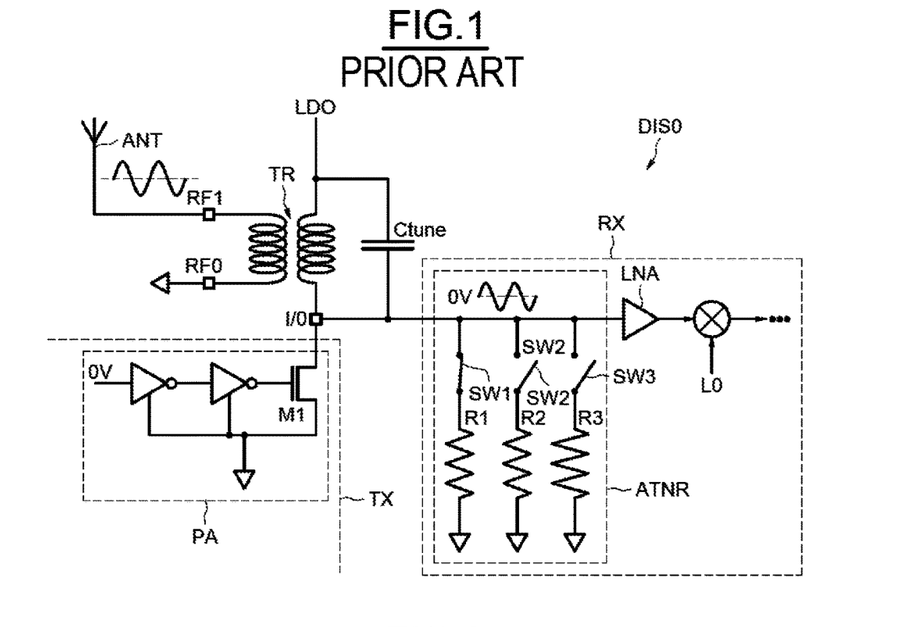
FIG. 1 represents an exemplary customary radiofrequency transmission device.

An exemplary radiofrequency transmission device DIS0 is represented by FIG. 1. The device DIS0 is incorporated into an integrated circuit and comprises in a customary manner an antenna ANT linked to receive RX and transmit TX stages on an input-output node I/O, by way of a transformer TR.

The transmit stage TX comprises a power amplifier PA intended to amplify a transmission signal, notably by means of a power transistor M1.

The receive stage RX comprises for its part a low noise amplifier LNA at the output of which a mixer carries out a frequency transposition with a signal generated by a local oscillator LO.

The transmit TX and receive RX stages are naturally implemented in an individual manner, the transmit stage TX being deactivated when the receive stage RX is in operation, and vice versa.

Moreover, in this example the receive stage comprises an attenuator circuit ATNR, making it possible to attenuate the reception signal received on the antenna ANT, so as to decrease the level of the signals picked up by the antenna so as to reduce them to measurable values within the appropriate dynamic range of the receive stage RX.

Customarily, attenuators are formed by circuits incorporated into the receive stage RX on an input-output node I/O situated between the transformer TR and the low noise amplifier LNA. For example, the attenuator ATNR is produced by a network of parallel resistors R1, R2, R3 of various values, wired up in series with respective switches SW1, SW2, SW3 between a ground terminal and the input-output node I/O.

Such an attenuator makes it possible to implement an attenuation of the reception signal according to an adjustable gain, as a function of the needs of the device and of the height of the reception signal.

This standard design introduces large parasitic capacitances, notably because of the switches SW1, SW2, SW3, which compromise the adjustment of the transformer TR and may create distortion of the reception signal.

Low noise amplifiers with degenerate gain make it possible moreover to attenuate a reception signal, but their differential design introduces noise into the receive chain, in particular in low-energy operation.

It is desirable to remedy these defects in common-mode operation, notably within the framework of radiofrequency transmissions of the Wifi or low energy-consumption Bluetooth type "BLE" (the acronym standing for "Bluetooth Low Energy").

SUMMARY

Embodiments of the invention disclose a common-mode radiofrequency transmission device in which the power transistor of the transmit stage is advantageously also used during reception, in the guise of adjustable resistor. The power transistor is regulated in the triode mode (or linear mode) so as to attenuate the reception signal according to an adjustable gain, without undergoing the constraints of the above-mentioned designs.

According to one aspect there is proposed a method comprising a signal reception phase comprising an attenuation of a signal received, and a signal transmission phase comprising before transmission an amplification by a power transistor of a signal to be transmitted, the attenuation comprising a placing of the power transistor in a triode mode in which the power transistor has a resistive value.

By "transistor in triode mode" is meant a transistor in the linear regime, that is to say that the current flowing in its conduction terminals is substantially proportional, according to a value called the resistive value, to the voltage present between the terminals, for a given gate voltage, and before saturation. The resistive value of a transistor in triode mode depends on the gate voltage applied to it.

Thus in the method according to this aspect, profit is advantageously derived notably from an electronic component already present in the integrated circuit and which is not used during the reception of a reception signal.

In particular, the attenuation of a reception signal according to this aspect makes it possible to circumvent the problems of parasitic capacitances of the attenuations implemented by attenuators of customary design.

Moreover, the transmissions and receptions of signals naturally being done separately, this aspect makes it possible to optimize the use of the components of a device, for example, of the radiofrequency transmission device type.

According to one mode of implementation, the placing of the power transistor in the triode mode comprises a delivering of a control voltage on the gate of the power transistor, obtained on the basis of the comparison between a benchmark voltage across the conduction terminals of a benchmark transistor and a model voltage across the terminals of a model resistive circuit.

This mode of implementation makes it possible notably to compensate for the variations of the transistor's characteristics (or parameters) such as random variations due to changes of temperature or systematic variations caused by random contingencies of fabrication methods. Indeed the benchmark transistor can advantageously be fabricated simultaneously with the power transistor, so they will undergo the same variations (random and systematic) of their characteristics, and thus this mode of implementation makes it possible to apply a control voltage whose effect is not affected by these variations.

According to one mode of implementation, the delivering of the control voltage comprises an adjustment of the model voltage, adjusting the value of the control voltage to a value which places the power transistor in a triode mode at a desired resistive value.

This mode of implementation makes it possible notably to adjust the gain of the attenuation, for example, between 0 and −18 dB.

According to another aspect there is proposed a transmission device comprising a transmit stage intended to deliver a transmission signal on an input-output node of an antenna and comprising a power transistor connected to the input-output node and configured to amplify a signal to be transmitted, a receive stage intended to receive a reception signal on the input-output node and comprising an attenuator for attenuating the reception signal, in which the attenuator comprises the power transistor and a controller able to place the power transistor in a triode mode in which the power transistor has a resistive value.

The radiofrequency transmission device according to this aspect advantageously exploits an electronic component already present in the integrated circuit incorporating the device, and which is not used during reception.

In particular, the proposed device makes it possible to circumvent the problems of parasitic capacitances of the attenuations implemented by attenuators of customary design.

Moreover, the transmissions and receptions of signals naturally being done separately, the proposed device makes it possible to optimize the use of the components present in the integrated circuit incorporating the proposed device.

The conduction terminals of the power transistor are for, example, respectively coupled to the input output node and to a terminal intended to receive a reference voltage.

According to one embodiment, the controller comprises a model resistive circuit, a group of at least one benchmark transistor, a differential amplifier, the model resistive circuit is coupled between a first input of the differential amplifier and a terminal intended to receive a reference voltage, the benchmark transistor group is coupled between a second input of the differential amplifier and the terminal intended to receive a reference voltage, and the output of the differential amplifier is coupled to the gate of the at least one benchmark transistor of the group and to the gate of the power transistor.

the at least one benchmark transistor of the group is advantageously paired with the power transistor, that is to say having the same characteristics, to within a size factor, as those of the power transistor.

This configuration makes it possible notably to compensate the variations of the transistor's parameters, such as the random variations due to changes of temperature or the systematic variations caused by random contingencies of fabrication methods.

According to one embodiment, the differential amplifier comprises a current-generating stage configured to make a first current flow in the model resistive circuit and to make a second current flow in the at least one benchmark transistor of the group, the differential amplifier being configured so that a differential between the first and second currents produces a variation of the control voltage.

The model voltage is thus generated by the passage of the first current through a resistive circuit, and the benchmark voltage is generated by the passage of the second current through the benchmark transistor in triode mode, i.e., a resistive element also.

This embodiment makes it possible to pass the current used to implement the differential amplification through the benchmark transistor, in the guise of second current. This exhibits the advantage of being substantially economical in regard to energy consumption.

According to one embodiment, the controller comprises an instruction circuit configured to generate at least one digital control signal making it possible to adjust the control voltage to a value which places the power transistor in a triode mode at a desired resistive value.

This makes it possible notably to adjust the gain of the attenuation, for example, between 0 and −18 dB.

According to one embodiment, the group of at least one benchmark transistor comprises several transistors linked in parallel by way of at least one first switch controllable by a first control signal.

This makes it possible to adjust the resistive value of the power transistor in the triode mode by modifying the size factor between the power transistor and the benchmark transistor.

According to one embodiment, the resistive circuit comprises several resistors mounted in series, and second switches controllable by respective second control signals and connected between a terminal intended to receive a reference voltage and respective nodes situated between resistors of the series.

In other words, the model resistive circuit can be an arrangement of the voltage-divider bridge type, making it possible to modify the equivalent resistance of the resistive circuit, so as to adjust the resistive value of the power transistor.

According to one embodiment, the current-generating stage is configured to make the first and second currents flow according to pairs of different values as a function of a third control signal.

This makes it possible to adjust the resistive value of the power transistor by modifying the current supplying the differential amplifier.

According to one embodiment, the attenuator comprises a cutoff switch with two positions controllable by a fourth control signal, the first position coupling the gate of the power transistor to the output of the differential amplifier, the other position coupling the gate of the power transistor to a terminal intended to receive a reference voltage, typically the ground.

Generally, the transmission and reception signals are, for example, radiofrequency signals.

There is also proposed an electronic apparatus, such as a mobile telephone or a personal computer, comprising a radiofrequency transmission device such as defined hereinabove.

BRIEF DESCRIPTION OF THE DRAWINGS

Other advantages and characteristics of the invention will become apparent on examining the detailed description of wholly non-limiting embodiments and modes of implementation and of the appended drawings in which.

DETAILED DESCRIPTION OF ILLUSTRATIVE EMBODIMENTS

Figure 2:
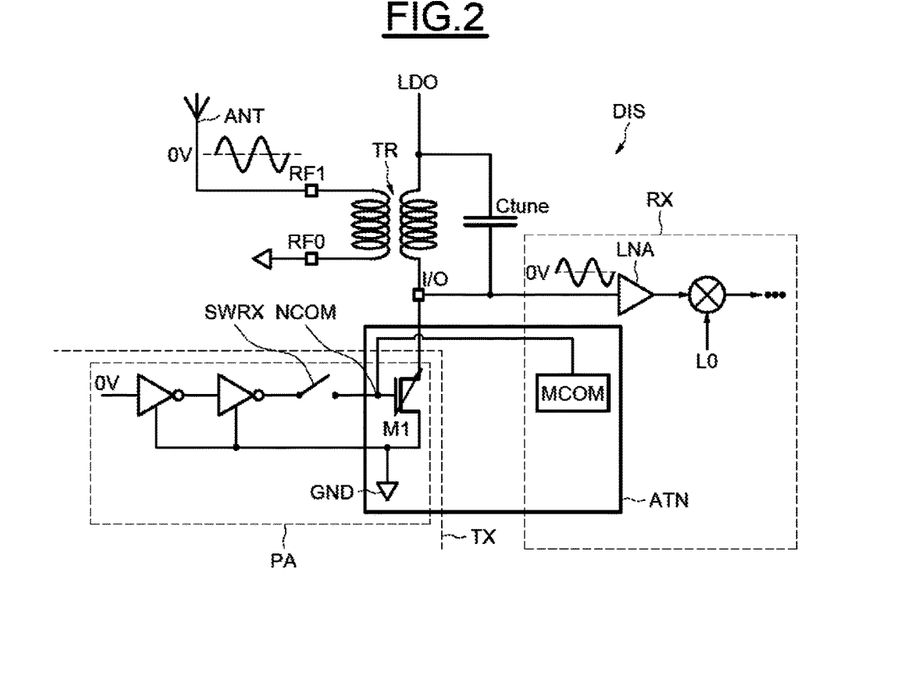
FIGS. 2 to 7 represent various embodiments and modes of implementation of a radiofrequency transmission device according to the invention.

FIG. 2 represents a radiofrequency transmission device DIS comprising an antenna ANT coupled on a so-called input-output node I/O to the remainder of the device by way of a transformer TR.

The transformer TR comprises in a conventional manner a primary inductive circuit and a secondary inductive circuit, interleaved with one another, as well as a compensation capacitor Ctune.

The main function of the transformer TR is to present to the antenna an impedance which is independent of the remainder of the circuit, usually fixed at 50 ohms.

A receive stage RX and a transmit stage TX are connected to an input-output node I/O of the secondary circuit of the transformer TR.

The transmit stage TX comprises in a customary manner a power amplifier PA intended to amplify a transmission signal, notably by means of a power transistor M1.

The transmit stage TX is of conventional design and known per se, advantageously optimized as regards interaction with the remainder of the integrated circuit, in particular the transmit-receive chain coupled to the input-output node I/O.

The receive stage RX comprises an attenuator ATN which comprises the power transistor M1 and a controller MCOM able to control the power transistor M1 on a control node NCOM coupled to its gate.

A switch SWRX makes it possible to disconnect the gate of the power transistor M1 from the remainder of the power-amplifying circuit PA, for example, the switch SWRX is in the closed position during transmission of a transmission signal.

The receive stage RX comprises for its part a low noise amplifier LNA at the output of which a mixer carries out a frequency transposition with a signal generated by a local oscillator LO in a conventional manner, followed by a processing circuit for the receive chain, such as, for example, a demodulator.

The function of the attenuator ATN is to apply a control voltage on the control node NCOM so as to use the power transistor M1 of the transmit stage TX during reception in the guise of adjustable resistor, by placing it in the triode mode with a given resistive value.

During reception, the switch SWRX is then in the open position.

The power transistor M1 is, in this example, an N-type transistor whose drain is connected to the input-output node and whose source is connected to a terminal GND intended to receive a reference voltage, for example, the ground.

The control voltage (Vcom), regulating the resistance of the power transistor M1 in triode mode, thus makes it possible to attenuate the reception signal according to an adjustable gain and in an optimal manner.

Figure 3:
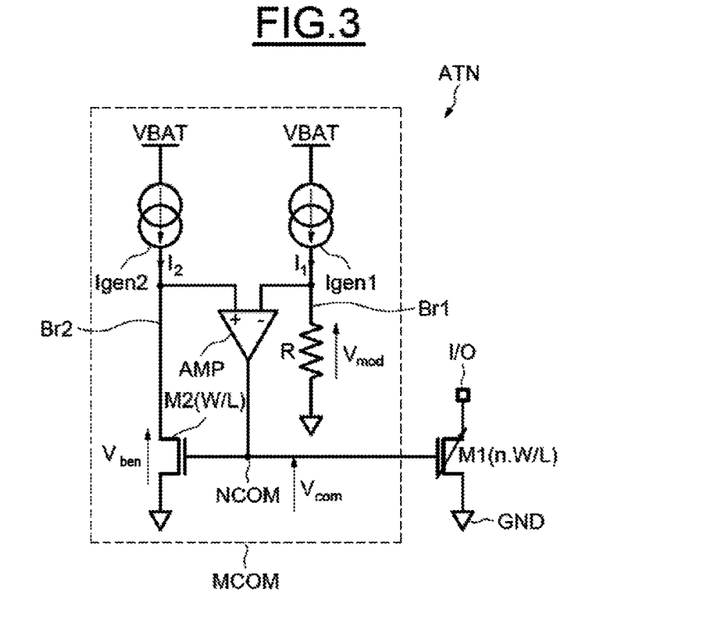

FIG. 3 represents an embodiment of the attenuator ATN.

The attenuator ATN comprises a controller MCOM able to place the power transistor M1 in the triode regime, so as to use it as an adjustable resistor, having a desired resistive value.

The controller MCOM comprises a first current source Igen1, generating a first current I1 in a first branch Br1, and a second current source Igen2, generating a current I2 in a second branch Br2.

On the first branch Br1, a resistive circuit linked to the ground GND, here a resistor R, passes the current I1, producing a so-called model voltage Vmod across its terminals, Vmod=R*I1.

The current I2 flows from the drain to the source of a transistor called a benchmark transistor M2, the source of the transistor M2 being linked to the ground GND.

The current I2 flowing in the conduction terminals of the benchmark transistor M2 in triode mode produces a benchmark voltage Vben between the drain and the source of the benchmark transistor M2.

The benchmark voltage Vben can be expressed in the form Vben=$R_{M2}$*I2, with $R_{M2}$ an expression for the resistive value, or resistance, of the transistor M2 in triode mode.

According to an acceptable approximation of the resistance $R_{M2}$, $1/R_{M2}$=kn/2*(W/L)*(Vgs−Vth), with kn the characteristic constant of the transistor M2, W the width of its active region, L the length of its active region, Vth its threshold voltage and Vgs the voltage present between the gate and the source of the transistor M2.

The gate of the benchmark transistor M2 is coupled to the control node NCOM, to which moreover the gate of the power transistor M1 is coupled.

A differential amplifier AMP receives on a positive input the benchmark voltage Vben and on a negative input the model voltage Vmod, and applies to the control node NCOM a control voltage Vcom representative of the difference of the benchmark and model voltages present on the positive and negative inputs.

Consequently the control voltage Vcom will control the resistance $R_{M2}$ of the benchmark transistor M2 in triode mode and thus cause the benchmark voltage Vben to vary until a state of balance is attained between the benchmark and model voltages.

In other words, the differential amplifier AMP is configured to balance the benchmark voltage Vben against the model voltage Vmod, by varying the control voltage Vcom.

The power transistor M1 and benchmark transistor M2 are paired, that is to say that the transistor M2 is produced according to the same technological method as the transistor M1, making it possible to produce these transistors M1 and M2 with the same characteristics, or parameters, to within a size factor here.

More precisely, the transistors M1 and M2 have the same characteristic constant kn, the same threshold voltage Vth, the same length L, but a width W differing by a factor n, that is to say $W_{M1}$=n*$W_{M2}$, with $W_{M1}$ the width of the power transistor M1 and $W_{M2}$ the width of the benchmark transistor M2.

Produced as they are during one and the same technological method, the systematic variations of these characteristics are also the same for the two transistors.

Belonging as they do to one and the same integrated circuit, the random variations, for example, due to temperature, are also the same for the two transistors.

Consequently, the resistive value, or resistance, $R_{M1}$ of the power transistor M1 in triode mode is proportional to the resistance $R_{M2}$ of the benchmark transistor M2, with $R_{M1}$=$R_{M2}$/n, and the effective resistance $R_{M2}$ of the benchmark transistor M2 will support the same random and systematic variations as the effective resistance $R_{M1}$ of the power transistor M1.

Thus, this embodiment makes it possible to precisely control the tailoring of the effective resistance $R_{M1}$ of the power transistor M1 on the basis of the model voltage Vmod, arising from the passage of the current I2 through a resistor R whose embodiments are well mastered and vary only a little, on the basis of the concrete behaviour of the transistor M2 very similar to the concrete behaviour of the power transistor M1.

Figure 4:
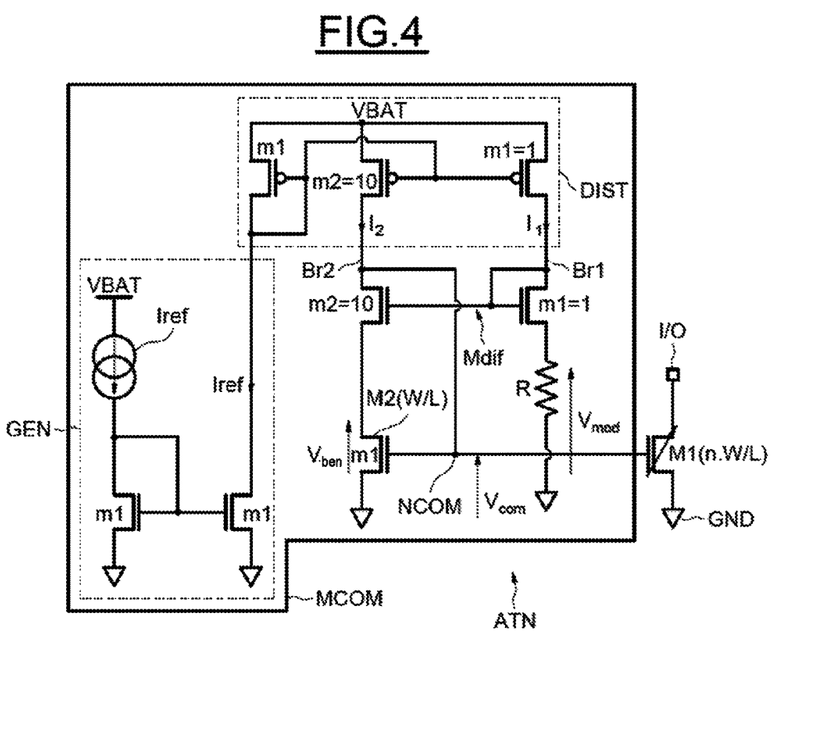

FIG. 4 represents an advantageous embodiment of the attenuator ATN.

The controller MCOM comprises a current-generating circuit GEN which generates a reference current Iref transmitted to a current-distributing circuit DIST by customary circuitry of a current mirror arrangement of nMOS transistors.

The current distributing circuit DIST comprises a current mirror arrangement of pMOS transistors, distributing, on the basis of the reference current Iref and of a supply voltage VBAT, the first current I1 in the first branch Br1 and the second current I2 in the second branch Br2 of the circuit of the controller MCOM.

In a similar manner to the representation of FIG. 3, the resistor R is connected to the first branch Br1 and to the ground GND, and the benchmark transistor M2 is connected to the second branch Br2 on its drain and to the ground GND on its source. The gate of the benchmark transistor M2 is coupled to the control node NCOM.

Moreover, a current mirror arrangement of nMOS transistors Mdif copies the current I1 flowing in the first branch Br1 to the second branch Br2, and the voltage present on the part of the first branch Br1 situated between the current-distribution circuit DIST and the current mirror Mdif is applied to the control node NCOM.

Consequently, by balancing the voltages obtained by passing currents through resistive components, the current mirror arrangement Mdif makes it possible to produce on the control node NCOM a control voltage Vcom representative of the differential between the currents I2 and I1 flowing respectively in the benchmark transistor M2 and the resistor R.

The voltage Vcom controlling the resistance of the benchmark transistor M2, a state of balance is attained when the benchmark voltage Vben is equal to the model voltage Vmod.

This state of balance corresponds to a control voltage Vcom controlling the effective resistance $R_{M2}$ of the benchmark transistor M2, equal to the effective resistance R.

In other words, the arrangement which has just been described corresponds to a differential amplifier with current feedback using the amplification current (I2) to resistively generate the benchmark voltage (Vben).

The attenuator ATN thus makes it possible to render the power transistor M1 resistive according to a controlled and stable resistance value, here equal to the resistance R, and furthermore in an energy-economical manner.

The resistive circuit R can be a variable resistor controlled by a controller MCOM, thus making it possible to implement an attenuation of the reception signal according to an adjustable gain, for example, chosen between 0 dB and −18 dB.

Moreover, the pMOS transistors copying the reference current Iref in the first and second branch Br1, Br2 can have respectively different coefficients of size m1, m2, for example, m1=1 and m2=10.

By coefficient of size is meant here that the width of the pMOS transistor linked to the first branch Br1 equals m1*W, and the width of the pMOS transistor linked to the second branch Br2 equals m2*W, with W a reference width.

Thus the current I2 is m2/m1 times bigger than the current I1.

The current mirror arrangement Mdif is then produced according to the same ratio m2/m1.

Figure 5:
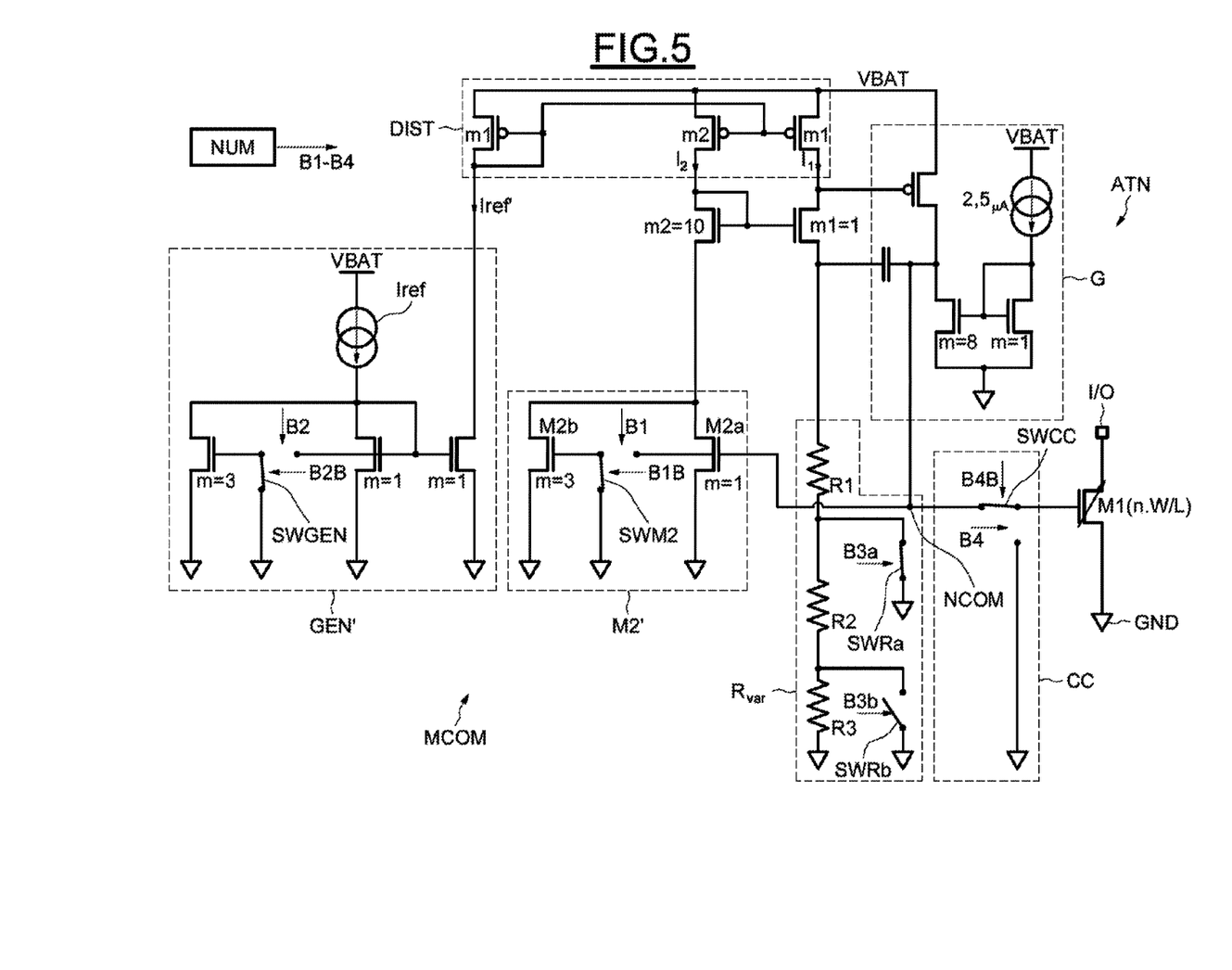

FIG. 5 represents an example of an advantageous embodiment of the attenuator ATN.

This embodiment comprises different "modules" (that is to say a group of benchmark transistors M2', an adjustable current-generating stage GEN', a variable resistive circuit Rvar, and a circuit breaker arrangement CC) making it possible to adjust the control voltage Vcom to a value which places the power transistor M1 in a triode mode according to a desired resistive value.

Instruction circuitry NUM is configured to generate digital control signals B1, B2, B3, B4 controlling the various "modules" so as to adjust the resistive value of the power transistor M1 to the desired value.

The desired resistive value can, for example, correspond to attenuations of 0 dB, −6 dB, −12 dB or −18 dB.

On the one hand, a group of several benchmark transistors M2' comprises in this example a first and a second benchmark transistor M2a, M2b, linked in parallel via a switch with two positions SWM2.

The switch SWM2 is controlled by a first digital control signal B1/B1B generated by the instruction circuitry NUM. The logical value B1 controls a first position in which the gate of the second benchmark transistor M2b is coupled to the gate of the first benchmark transistor M2a (and thus also to the control node MCOM).

The complementary logical value B1B of the value B1 controls the second position of the switch SWM2, in which the gate of the other benchmark transistor M2b is coupled to the ground GND.

In other words, this group of benchmark transistors M2' forms an equivalent benchmark transistor (M2') whose size factor is controllable by a first control signal B1/B1B.

Consequently, the size factor n between the benchmark transistor M2' and the power transistor M1 can be modified, modifying the resistance RM1 of the power transistor M1 according to an inverse factor, thus adjusting the gain of the attenuation.

For example, with respect to an unitary width, the size factor of the second benchmark transistor M2b can be equal to 3 and the size factor of the first benchmark transistor M2a equal to 1.

In this example the size factor n between the equivalent benchmark transistor M2' and the power transistor M1 is thus equal to 4 or to 1, as a function of the first control signal B1.

Moreover, an adjustable current-generating stage GEN' is configured to be able to generate a reference current Iref that may have two intensity values.

In the adjustable current-generating stage GEN', a current mirror arrangement causes a current Iref to flow towards the current distributing circuit DIST.

The diode-mounted transistor of the current mirror arrangement also comprises a first and a second transistor linked in parallel via a switch with two positions SWGEN controlled by a second control signal B2.

The logical value B2 sets the switch SWGEN to a position coupling the gates of the transistors, and the complementary logical value B2B to a position coupling the gate of the second diode-mounted transistor to the ground GND.

Thus the reference current Iref flowing in the distribution circuit can have two possible values, controlled by the second control signal B2 and dependent on the size factors of the parallel-mounted transistors.

Moreover, a variable resistive circuit Rvar comprises, in this example, three resistors R1, R2, R3 mounted in series between the input-output node I/O and the ground terminal GND.

Two controllable switches SWRa, SWRb, respectively connected to a node situated between the resistors R1 and R2 and a node situated between the resistors R2 and R3, make it possible to link the nodes to the ground GND.

The switches SWRa, SWRb are respectively controlled by two third control signals B3a, B3b, making it possible to control the equivalent resistance of the variable resistive circuit in the manner of a voltage-divider bridge arrangement.

For example, the series of resistance can comprise a resistance R1 of 16.71 kΩ, a resistance R2 of 35.55 kΩ and a resistance R3 of 8.12 kΩ.

Moreover, a circuit breaker arrangement CC makes it possible to couple the gate of the power transistor M1 either to the control node NCOM, in which case an attenuation is implemented, or to a reference voltage terminal GND, in which case the power transistor M1 is off and no attenuation is implemented.

The circuit breaker arrangement CC comprises a switch with two positions SWCC controlled by a fourth control signal B4.

The logical value B4 controls a coupling of the gate of the power transistor M1 to the reference voltage GND, and the complementary logical value B4B of the value B4 controls a coupling of the gate with the control node NCOM.

In other words, the controller MCOM is configured to adjust the value of the size factor and/or of the variable resistance and/or of the reference current, so as to adjust the control voltage to a value which places the power transistor in a triode mode at a desired resistive value.

Furthermore, in the example represented by FIG. 5, the attenuator ATN comprises a gain stage G, making it possible to apply a control voltage Vcom representing a differential between the currents I2 and I1 flowing respectively in the equivalent benchmark transistor M2' and in the variable resistive circuit Rvar, in an amplified and more precise manner than notably in the embodiment described in conjunction with FIG. 4.

Figure 6:
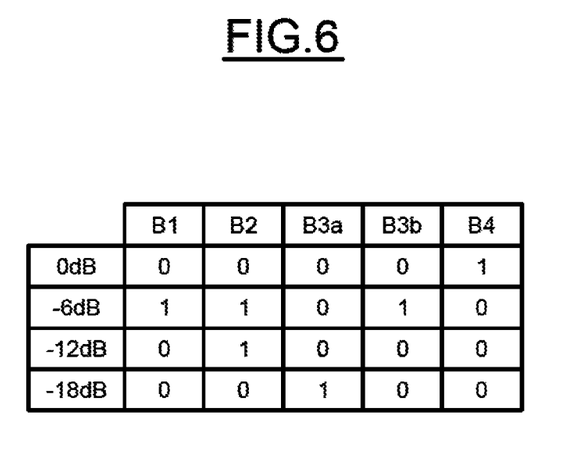

FIG. 6 represents a table of the logical values B1, B2, B3a, B3b and B4 making it possible to implement examples of attenuations with various gains.

The values of gains of the table correspond to the configuration of the example represented in FIG. 5, in which the various components of the attenuator ATN have as values the examples given previously, with an initial current Iref of 1 μA.

In order not to implement any attenuation, i.e., 0 dB gain attenuation, the signals B1, B2, B3a, B3b are at a low value, the signal B4 is at a high value and the power transistor M1 is off.

For a −6 dB gain attenuation, the signals B1, B2 and B3b are at a high value, and the signals B3a and B4 are at a low value.

For a −12 dB gain attenuation, the signal B2 is at a high value, the signals B1, B3a, B3b and the signal B4 are at a low value.

For a −18 dB gain attenuation, the signal B3a is at a high value, the signals B1, B2, B3b, and B4 are at a low value.

Figure 7:
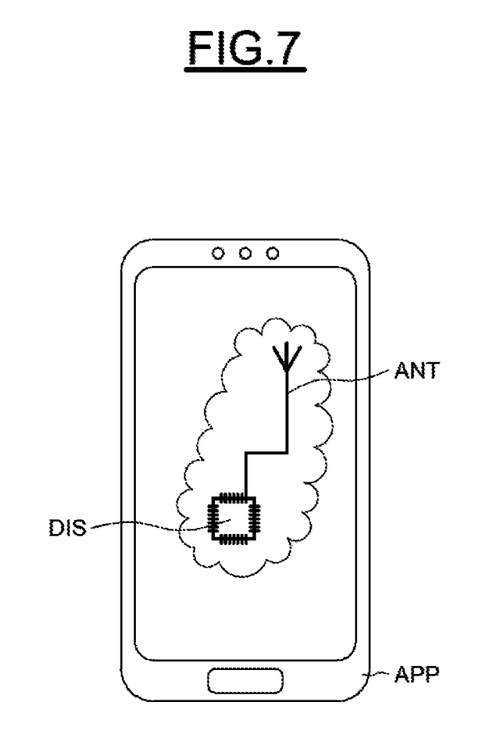

FIG. 7 represents an electronic apparatus APP, such as a touch-sensitive tablet or a personal computer, here a mobile telephone, comprising a radiofrequency transmission device DIS.

The apparatus APP is for, example, notably intended to carry out radiofrequency transmissions on an antenna ANT, such as communications of the Wifi, Zigbee, Bluetooth or BLE ("Bluetooth Low Energy") type, whose reception may require an attenuation, if appropriate implemented by the attenuator ATN of the device DIS.

The invention is not limited to these embodiments but embraces all variants thereof. For example, whilst a composition simultaneously comprising several modules (GEN', M2', Rvar, CC) has been described hereinabove in conjunction with FIG. 5, it will be possible to produce various compositions of certain at least of the modules independently or in combination, and able to support design variants.

What is claimed is:

1. A method comprising:
    performing a signal reception phase that comprises an attenuation of a signal received with an antenna; and
    performing a signal transmission phase that comprises, before transmission, an amplification by a power transistor of a signal to be transmitted with the antenna, wherein the attenuation comprises placing the power transistor in a triode mode, and wherein the power transistor comprises a current path coupled to the antenna.

2. The method of claim 1, wherein placing the power transistor in the triode mode comprises delivering a control voltage to a gate of the power transistor, the control voltage obtained based on a comparison between a benchmark voltage across conduction terminals of a benchmark transistor and a model voltage across terminals of a model resistive circuit.

3. The method of claim 2, wherein delivering the control voltage comprises adjusting the control voltage to a value which places the power transistor in a triode mode with a desired resistive value.

4. The method according of claim 1, wherein the signal received and the signal to be transmitted are radio frequency signals.

5. A transmission device comprising:
    a transmit stage configured to deliver a transmission signal on an input-output node of an antenna and comprising a power transistor having a current path coupled to the input-output node and configured to amplify a signal to be transmitted with the antenna, and
    a receive stage configured to receive with the antenna a reception signal on the input-output node and comprising an attenuator circuit for attenuating the reception signal, wherein the attenuator circuit comprises the power transistor and a control circuit configured to place the power transistor in a triode mode.

6. The transmission device of claim 5, wherein conduction terminals of the power transistor are respectively coupled to the input-output node and to a reference terminal configured to receive a reference voltage.

7. The transmission device of claim 5, wherein the control circuit comprises:
    a model resistive circuit;
    a first benchmark transistor; and
    a differential amplifier, wherein
        the model resistive circuit is coupled between a first input of the differential amplifier and a reference terminal configured to receive a reference voltage,
        the first benchmark transistor is coupled between a second input of the differential amplifier and the reference terminal, and
        an output of the differential amplifier is coupled to a gate of the first benchmark transistor and to a gate of the power transistor.

8. The transmission device of claim 7, wherein the first benchmark transistor is paired with the power transistor.

9. The transmission device of claim 7, wherein the differential amplifier comprises a current-generating stage configured to
    make a first current flow in the model resistive circuit, and
    make a second current flow in the first benchmark transistor the, wherein the differential amplifier is configured so that a differential between the first and second currents produces a variation of a control voltage at the gate of the power transistor.

10. The transmission device of claim 5, wherein the transmission and reception signals are radio frequency signals.

11. A transmission device comprising:
    a transmit stage configured to deliver a transmission signal on an input-output node of an antenna and comprising a power transistor coupled to the input-output node and configured to amplify a signal to be transmitted, and a receive stage configured to receive a reception signal on the input-output node and comprising an attenuator circuit for attenuating the reception signal, wherein the attenuator circuit comprises the power transistor and a control circuit configured to place the power transistor in a triode mode, wherein the control circuit comprises:

a first circuit comprising a current-generating stage, a first node, a second node, and a third node;

a model resistive circuit coupled between the first node of the first circuit and a reference terminal configured to receive a reference voltage, wherein the current-generating stage is configured to make a first current flow in the model resistive circuit;

a first benchmark transistor coupled between a second node of the first circuit and the reference terminal, wherein the third node of the first circuit is coupled to a gate of the first benchmark transistor and to a gate of the power transistor and wherein the current-generating stage is further configured to make a second current flow in the first benchmark transistor; and an instruction generator configured to generate at least one digital control signal configured to adjust a control voltage at the third node to a value which places the power transistor in the triode mode at a desired resistive value.

12. The transmission device of claim 11, wherein the first benchmark transistor is part of a group of benchmark transistors comprising several benchmark transistors linked in parallel by way of at least one first switch controllable by a first control signal.

13. The transmission device of claim 11, wherein the model resistive circuit comprises several resistors mounted in series, and second switches controllable by respective second control signals and coupled between the reference terminal and respective nodes situated between resistors of the series.

14. The transmission device of claim 11, wherein the current-generating stage is configured to make the first and second currents flow according to pairs of different values as a function of a third control signal.

15. The transmission device of claim 11, wherein the attenuator circuit comprises a cutoff switch with two positions controllable by a fourth control signal, a first position of the cutoff switch coupling the gate of the power transistor to the third node of the first circuit, and a second position of the cutoff switch coupling the gate of the power transistor to the reference terminal.

16. A circuit comprising:
a power transistor having
a gate coupled to a first circuit via a first switch;
a first load-path terminal coupled to a reference terminal, and
a second load-path terminal coupled to a first node, the first node coupled to a second circuit, the power transistor configured to produce an amplified signal at the first node; and a control circuit coupled to the gate of the power transistor, the control circuit configured to place the power transistor in a triode mode when the first switch is open, wherein the power transistor is configured to attenuate a second signal received at the first node.

17. The circuit of claim 16, wherein the first node is further coupled to a winding of a transformer.

18. The circuit of claim 17, wherein the second circuit comprises a receiver circuit having a low noise amplifier (LNA) coupled to a mixer.

19. The circuit of claim 16, wherein the control circuit comprises:
an amplifier having an output coupled to the gate of the power transistor;
a model resistive circuit coupled between the reference terminal and a first input of the amplifier; and
a benchmark transistor coupled between the reference terminal and a second input of the amplifier, the benchmark transistor having a gate coupled to the gate of the power transistor.

20. The circuit of claim 19, wherein the first and second inputs of the amplifier are coupled to respective first and second current generators.

21. The transmission device of claim 5, wherein the power transistor comprises:
a gate coupled to a first circuit of the transmit stage via a first switch,
a first load-path terminal coupled to a reference terminal, and
a second load-path terminal coupled to the input-output node.

22. The circuit of claim 16, further comprising a transmit stage configured to deliver a transmission signal on the first node, the transmit stage comprising the power transistor, wherein the second circuit is a receive stage configured to receive a reception signal on the first node.

* * * * *